US008525293B2

(12) United States Patent
Feilchenfeld et al.

(10) Patent No.: US 8,525,293 B2
(45) Date of Patent: Sep. 3, 2013

(54) BIPOLAR TRANSISTOR WITH RAISED EXTRINSIC SELF-ALIGNED BASE USING SELECTIVE EPITAXIAL GROWTH FOR BICMOS INTEGRATION

(75) Inventors: Natalie B. Feilchenfeld, Jericho, VT (US); Bradley A. Orner, Fairfax, VT (US); Benjamin T. Voegeli, Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/472,044

(22) Filed: May 15, 2012

(65) Prior Publication Data

US 2012/0319233 A1 Dec. 20, 2012

Related U.S. Application Data

(62) Division of application No. 12/949,108, filed on Nov. 18, 2010, now Pat. No. 8,236,662, which is a division of application No. 11/680,163, filed on Feb. 28, 2007, now Pat. No. 7,892,910.

(51) Int. Cl.
    *H01L 29/73* (2006.01)
(52) U.S. Cl.
    USPC .................................. 257/517; 257/E29.174
(58) Field of Classification Search
    USPC .................................. 257/517, 370, E29.174
    See application file for complete search history.

(56) References Cited

U.S. PATENT DOCUMENTS

| | | | |
|---|---|---|---|
| 6,455,364 B1 | 9/2002 | Asai et al. | |
| 6,667,521 B2 | 12/2003 | Ahlgren et al. | |
| 6,780,695 B1 * | 8/2004 | Chen et al. | 438/202 |
| 6,893,934 B2 * | 5/2005 | Ohnishi et al. | 438/369 |
| 6,927,476 B2 | 8/2005 | Freeman et al. | |
| 6,960,820 B2 | 11/2005 | Freeman et al. | |
| 6,965,133 B2 | 11/2005 | Geiss et al. | |
| 6,972,443 B2 | 12/2005 | Khater | |

(Continued)

FOREIGN PATENT DOCUMENTS

CN 1215569 C 8/2005

OTHER PUBLICATIONS

Comfort, J. H., et al., "Selective Extrinsic Base Deposition for an NTX SiGe HBT Process", TDB, (May 1994) pp. 51-54, vol. 37, No. 5.

English Abstract of JP2004532534 (A), Oct. 21, 2004.

(Continued)

*Primary Examiner* — William D Coleman
*Assistant Examiner* — Christine Enad
(74) *Attorney, Agent, or Firm* — Scully, Scott, Murphy & Presser, P.C.; Anthony J. Canale

(57) ABSTRACT

High performance bipolar transistors with raised extrinsic self-aligned base are integrated into a BiCMOS structure containing CMOS devices. By forming pad layers and raising the height of an intrinsic base layer relative to the source and drain of preexisting CMOS devices and by forming an extrinsic base through selective epitaxy, the effect of topographical variations is minimized during a lithographic patterning of the extrinsic base. Also, by not employing any chemical mechanical planarization process during the fabrication of the bipolar structures, complexity of process integration is reduced. Internal spacers or external spacers may be formed to isolate the base from the emitter. The pad layers, the intrinsic base layer, and the extrinsic base layer form a mesa structure with coincident outer sidewall surfaces.

20 Claims, 15 Drawing Sheets

(56) References Cited

U.S. PATENT DOCUMENTS

| | | |
|---|---|---|
| 6,979,884 B2 | 12/2005 | Ahlgren et al. |
| 6,982,442 B2 | 1/2006 | Chan et al. |
| 7,026,666 B2 | 4/2006 | Kalnitsky et al. |
| 7,037,798 B2 | 5/2006 | Adam et al. |
| 2004/0188797 A1* | 9/2004 | Khater et al. ............ 257/510 |
| 2004/0222495 A1* | 11/2004 | Cantell et al. ............ 257/565 |
| 2005/0269594 A1* | 12/2005 | Chen et al. ............ 257/183 |
| 2007/0202642 A1 | 8/2007 | Nanda et al. |
| 2007/0298578 A1 | 12/2007 | Khater et al. |

OTHER PUBLICATIONS

English Abstract of JP2001035858 (A), Feb. 9, 2001.

* cited by examiner

BIPOLAR TRANSISTOR WITH RAISED EXTRINSIC SELF-ALIGNED BASE USING SELECTIVE EPITAXIAL GROWTH FOR BICMOS INTEGRATION

CROSS REFERENCE TO RELATED APPLICATION

This application is a divisional of U.S. patent application Ser. No. 12/949,108 filed Nov. 18, 2010, which is a divisional of U.S. patent application Ser. No. 11/680,163, filed Feb. 28, 2007, now U.S. Pat. No. 7,892,910 issued Feb. 22, 2011 the entire content and disclosures of which are incorporated herein by reference.

FIELD OF THE INVENTION

The present invention relates to semiconductor devices, and more particularly to BiCMOS integrated circuits having a raised extrinsic base formed by selective epitaxy and a mesa structure that includes the base.

BACKGROUND OF THE INVENTION

A key challenge in integrating high performance bipolar transistors into a BiCMOS circuit, as is utilized in high performance mixed signal applications, is to form high performance bipolar transistors without adversely affecting the performance of CMOS transistors and without introducing excessive process complexity during the manufacturing. While various methods of manufacturing bipolar transistors have been known in the art, not all of them can be employed in BiCMOS circuits since many of them are incompatible or substantially affect the performance of CMOS devices adversely. Only integration schemes that fully protect the performance CMOS devices can successfully integrate high performance bipolar transistors with CMOS devices without degradation of CMOS circuit performance.

To achieve high performance in a bipolar transistor, factors affecting the critical performance parameters of the bipolar transistor need to be considered such as the unit current gain frequency ($f_T$), which is the frequency at which the current gain becomes 1, and the maximum oscillation frequency ($f_{MAX}$), which is the maximum frequency at which there is still power gain. The two performance parameters, $f_T$ and $f_{MAX}$, critically depend on parasitic parameters of the bipolar transistor structure. The unit current gain frequency is inversely proportional to the product of base transit time ($t_b$) and collector-base capacitance ($C_{cb}$), that is, $f_T \propto 1/(t_b \times C_{cb})$. Since the base transit time increases with the thickness of the intrinsic base, high temperature must be avoided to minimize the thermal broadening of the intrinsic base. The maximum oscillation frequency is proportional to the square root of the unit current gain frequency and is inversely proportional to the produce of base resistance ($R_b$), which is the sum of both intrinsic and extrinsic resistance, and collector-base capacitance ($C_{cb}$), i.e., $f_{MAX} \propto (f_T/(R_b \times C_{cb}))^{0.5}$. To increase $f_{MAX}$, $f_T$ needs to be increased and both $R_b$ and $C_{cb}$ need to be decreased. Self-alignment of an extrinsic base to an emitter is thus preferred to reduce the base resistance, $R_b$, and consequently, to increase $f_{MAX}$.

Formation of raised extrinsic base in prior art bipolar transistors typically employs a chemical mechanical planarization (CMP) process. However, integration of raised extrinsic base bipolar transistors with CMOS devices in a BiCMOS circuit faces challenges since the patterned gate electrodes of CMOS devices introduces topographical variations, that is, differences between the height of the bipolar structures and the CMOS structures. These differences are on the order of the height of the gate electrodes of CMOS devices, typically in the range from about 100 to about 250 nm. The height of at least one type of structure is typically adjusted with an accompanying compromise in the device performance.

As disclosed in the U.S. Pat. No. 6,780,695, Chen et al. circumvents the problem of height differences between the device types by depositing a sacrificial polysilicon layer in a bipolar transistor area concurrently with a deposition of a gate polysilicon in the CMOS device area. The overall structure is planarized with a polysilicon placeholder material. A bipolar transistor is formed by removing the sacrificial polysilicon to expose an active silicon region, forming an intrinsic base and an emitter pedestal, and then forming an extrinsic base that is confined within the opening of the sacrificial polysilicon layer. While Chen et al., enables an integration scheme for high performance BiCMOS circuit, the complexity of the process increases by the introduction of additional steps, notably, the deposition of polysilicon placeholder material and planarization, deposition of a polysilicon layer over a base oxide and subsequent planarization utilizing an additional lithographic patterning.

Therefore, there exists a need to enable a high performance bipolar transistor with the benefits of self-aligned raised extrinsic base in a BiCMOS structure that contains at least one CMOS device.

There also exists a need to provide a high performance BiCMOS structure with minimum process complexity without compromising the performance of either the bipolar transistor or CMOS devices.

SUMMARY OF THE INVENTION

The present invention addresses the needs described above by providing structures and methods for a high performance BiCMOS circuit in which bipolar transistors with self-aligned raised extrinsic base are formed with CMOS devices.

The present invention also provides structures and methods in which a BiCMOS circuit is formed with less process complexity compared to the prior art, especially without utilizing chemical mechanical planarization (CMP) during the manufacture of the bipolar transistors.

According to the present invention, a semiconductor structure is disclosed which comprise:

a semiconductor substrate;

a collector located in the semiconductor substrate;

shallow trench isolation (STI) adjoining and surrounding the collector;

at least one pad layer located directly on the STI;

an intrinsic base layer located directly on the collector and directly on the at least one pad layer;

an emitter located directly on the intrinsic base layer;

an extrinsic base layer self-aligned to the emitter and directly contacting the intrinsic base layer; and a mesa structure with substantially planar and vertical sidewall surfaces, wherein each of the sidewall surfaces contains the at least one pad layer, the intrinsic base layer and the extrinsic base layer.

The above semiconductor structure can be integrated into a BiCMOS structure that contains at least one CMOS device located on the same semiconductor substrate. The at least one pad layer may comprise a stack of a pad oxide layer and a pad nitride layer. The extrinsic base may comprise a semiconductor material selected from the group that consists of doped silicon germanium alloy, doped silicon, doped silicon carbon alloy, and doped silicon germanium carbon alloy.

The above semiconductor structure may further comprise:
a first spacer located outside the emitter and contacting the emitter and the intrinsic base layer;
a second spacer contacting the first spacer, the emitter, and the extrinsic base layer; and
a third spacer containing the second spacer, the extrinsic base layer, and the second spacer layer.

In this case, preferably, the first spacer comprises a silicon oxide, the second spacer comprises a silicon nitride, and the third spacer comprises a silicon oxide.

In one aspect of the present invention, at least one pad layer is included in the mesa structure. The height of the intrinsic base layer and the height of the extrinsic base layer outside the active semiconductor area are raised due to the at least one pad layer. This compensates for the differential between the high growth rate of an epitaxial intrinsic base layer on the active semiconductor area and the low growth rate of a polycrystalline intrinsic base layer outside the active semiconductor area. Preferably, the thickness of the at least one pad layer is adjusted to match the height of the top surface of the polycrystalline intrinsic base layer within the bipolar transistor area.

Two embodiments for fabricating the semiconductor structure above are disclosed herein to demonstrate practicability. However, the present invention is not necessarily limited by the two embodiments. Shallow trench isolation and a subcollector layer are formed first. Typically, a collector and a subcollector contact for each bipolar transistor to be built are also formed. At least one active semiconductor area, which is an area of exposed epitaxial (single-crystalline) semiconductor surface surrounded by STI, is prepared in a bipolar device area. According to both embodiments, an intrinsic base layer is formed using the following common steps:
forming at lease one pad layer over an active semiconductor area;
forming an opening in the at least one pad layer to expose the active semiconductor area; and
depositing an intrinsic base layer directly on the active semiconductor area.

According to the first embodiment of the present invention, the above steps are followed by the following steps:
forming at least one emitter pedestal layer on the intrinsic base layer;
forming an emitter pedestal directly on the intrinsic base layer;
selectively depositing an extrinsic base layer on exposed portions of the intrinsic base layer;
forming a base cap dielectric layer on the extrinsic base layer; and
forming a mesa structure with substantially planar and vertical sidewall surfaces, wherein each of the sidewall surfaces contains the at least one pad layer, the intrinsic base layer and the extrinsic base layer.

According to the first embodiment, a second spacer is formed after the selective deposition of the extrinsic base layer.

According to the second embodiment of the present invention, the common steps above are followed by the following steps:
forming a pedestal etch stop layer on the intrinsic base layer;
forming at least one emitter pedestal layer on the pedestal etch stop layer;
forming an emitter pedestal directly on the intrinsic base layer;
removing portions of the pedestal etch stop layer that are not covered by the emitter pedestal;
selectively depositing an extrinsic base layer on exposed portions of the intrinsic base layer; and
forming a mesa structure with substantially planar and vertical sidewall surfaces, wherein each of the sidewall surfaces contains the at least one pad layer, the intrinsic base layer and the extrinsic base layer.

According to the second embodiment of the present invention, a second spacer is formed prior to the selective deposition of the extrinsic base layer.

In both embodiments, the extrinsic base layer is selectively deposited after the formation of an emitter pedestal. Therefore, the extrinsic base is self-aligned to the emitter. The process steps employed in either embodiments of the present invention are less both in number and in complexity compared to methods known in the prior art for high performance BiCMOS structures. Especially, no chemical mechanical polishing is required between the formation of the intrinsic base layer and the formation of the mesa structure, which is the last step unique to the fabrication of bipolar devices.

DETAILED DESCRIPTION OF THE INVENTION

Figure 1:
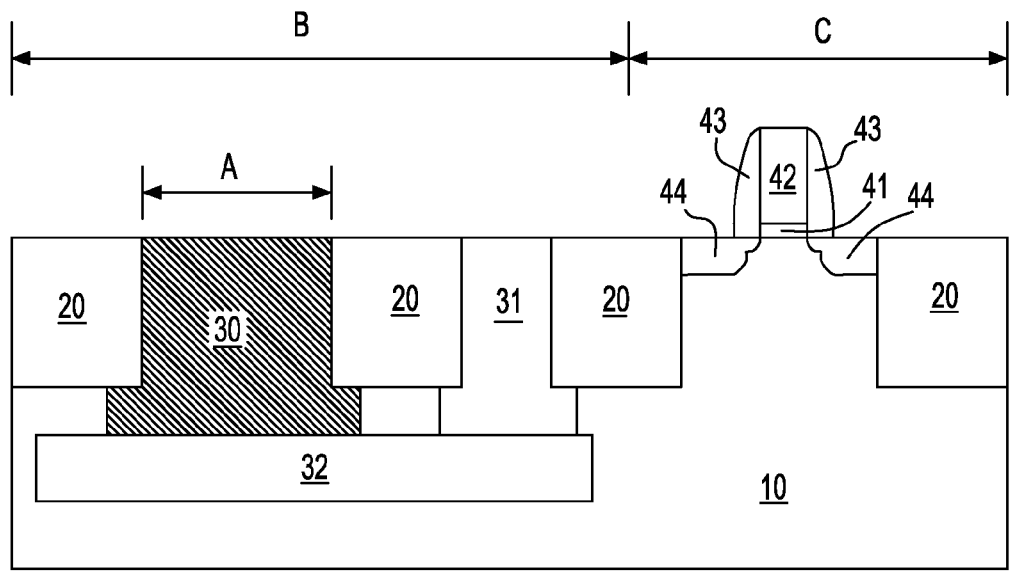
FIGS. 1-4 are sequential cross-sectional views of an exemplary BiCMOS structure during common process steps according to the first and the second embodiments of the present invention.

The present invention, which provides a bipolar transistor having a raised extrinsic base formed by selective epitaxy and a mesa structure including the base and methods of fabricating the same, will now be described in more detail by referring to the accompanying drawings. It is noted that like and corresponding elements are referred to by like reference numerals.

While the present invention may be practiced to fabricate a bipolar transistor structure without any CMOS devices on the same semiconductor substrate, the benefits of the present invention are maximized when practiced for a BiCMOS structure that contains CMOS devices. For the purposes of describing the present invention, an exemplary BiCMOS structure comprising a CMOS transistor and a bipolar transistor is employed. Applying the present invention to semiconductor structures to integrated circuits with multiple CMOS devices and bipolar devices is straightforward.

Referring to the vertical cross-sectional view of FIG. 1, a BiCMOS structure with a bipolar device area B, and a CMOS device area C, is provided. Preferably, shallow trench isolation 20 is formed in a semiconductor substrate 10. The semiconductor substrate may comprise a semiconductor material such as silicon, silicon germanium alloy, silicon carbon alloy, or silicon germanium carbon alloy. The doping of the semiconductor substrate may vary for optimal device performance.

A collector 30, a subcollector contact 31, and a CMOS device, which in this example is a MOSFET, are thereafter formed. The doping type of the collector is determined by the type of the bipolar transistor, i.e., n-type in an NPN transistor or p-type in a PNP transistor. The doping concentration of the collector 30 is in the range from about $1 \times 10^{18}/cm^3$ to about $1.0 \times 10^{21}/cm^3$, and preferably from about $1.0 \times 10^{19}/cm^3$ to about $1.0 \times 10^{20}/cm^3$. The thickness of the collector 30 is in the range from about 0.2 micron to about 1.5 micron, and preferably in the range from about 0.3 micron to about 0.5 micron. The doping profile and the thickness of the collector 30 are optimized for transistor performance. The subcollector 31 and the subcollector contact 31 are heavily doped with the same type dopants as the collector 30, typically at a concentration on the order of $1.0 \times 10^{21}/cm^3$. The MOSFET comprises a gate dielectric 41, a gate conductor 42, gate spacers 43, and source and drain regions 44. This structure has an active semiconductor area within the bipolar device area B. The active semiconductor area A is an area of exposed single-crystalline semiconductor surface over the collector 30, and is surrounded by an STI 20. The surface of the active area A preferably comprises the same material as the substrate 10.

Figure 2:
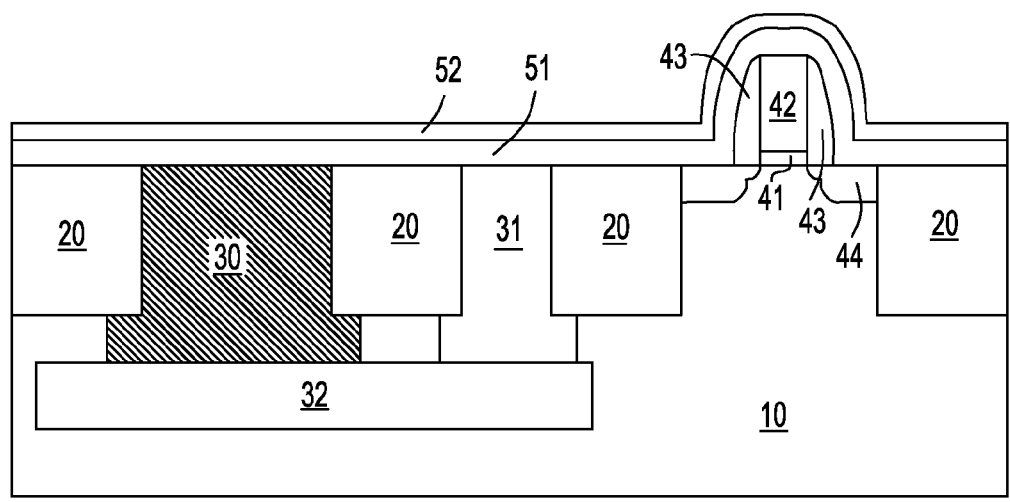

As shown in FIG. 2, at least one pad layer (51, 52) is deposited over the top surface of the semiconductor structure above. The at least one pad layer (51, 52) covers both the bipolar device area B and the CMOS device area C and directly contacts the active semiconductor area A, the STI 20, the top of the subcollector contact 31, and the gate conductor 42, the spacers 43, and the source and drain regions 44 of the MOSFET. The thickness of the at least one pad layer (51, 52) is preferably optimized to minimize topographical height variations of an intrinsic base layer and an extrinsic base layer within the bipolar device area B as they are formed subsequently. The thickness of the at least one pad layer (51, 52) is in the range from about 20 nm to about 200 nm, and preferably in the range from about 50 nm to about 110 nm. Preferably, the at least one pad layer (51, 52) comprises a stack of a first pad layer 51 and a second pad layer 52. Preferably, the first pad layer 51 is a silicon oxide layer and the second pad layer 52 is a silicon nitride layer. The thickness of the first pad layer is in the range from about 10 nm to about 100 nm, and preferably in the range from about 20 nm to about 50 nm. The thickness of the second pad layer is in the range from about 30 nm to about 60 nm.

Figure 3:
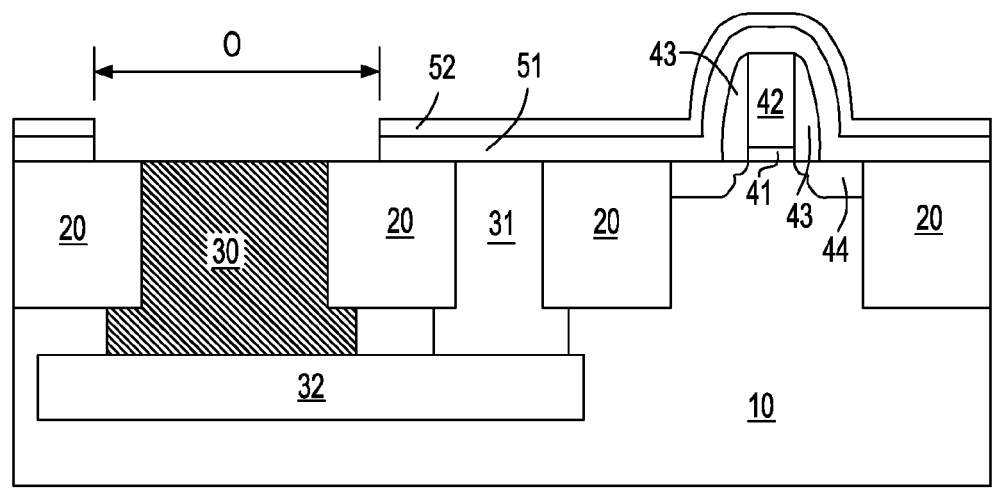

As shown in FIG. 3, the at least one pad layer is thereafter lithographically patterned and removed from over the active semiconductor area A such that the edge of the opening O is located within the STI 20 that surrounds the active semiconductor area A.

Figure 4:
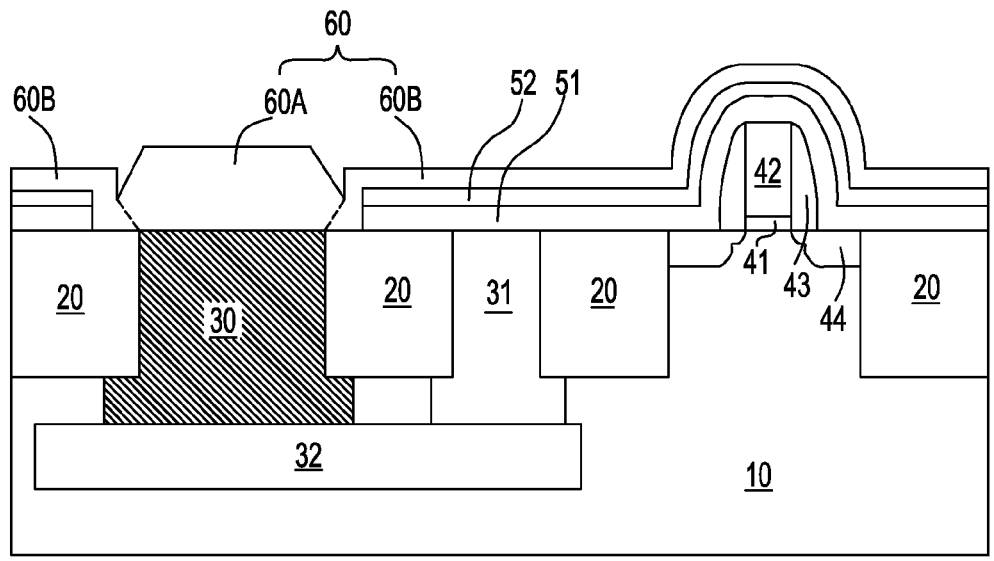

Referring to FIG. 4, after suitable surface cleaning to facilitate epitaxial growth of silicon or silicon alloy on the active semiconductor area, an intrinsic base layer 60 is formed over the top surface of preexisting semiconductor structure. The intrinsic base layer 60 comprises an epitaxial intrinsic base layer 60A and a polycrystalline intrinsic base layer 60B. The epitaxial intrinsic base layer 60A is formed with a high growth rate on and over the active semiconductor area A with an epitaxial alignment to the underlying collector 30. The polycrystalline intrinsic base layer 60B is formed with a low growth rate outside the active semiconductor area A wherein no epitaxial seeding surface is available, that is, over the STI 20 and over the at least one pad layer (51, 52). The boundaries between the epitaxial intrinsic base layer 60A and the polycrystalline intrinsic base layer B are marked with dotted lines in FIG. 4. Also, the edges of the epitaxial intrinsic base layer are typically form facets as shown in FIG. 4.

The intrinsic base layer 60 comprises a silicon-containing semiconductor material. Preferably the intrinsic base layer 60 comprises p-doped silicon, n-doped silicon, p-doped silicon germanium alloy, n-doped silicon germanium alloy, p-doped silicon carbon alloy, n-doped silicon carbon alloy, p-doped silicon germanium carbon alloy, n-doped silicon germanium carbon alloy, or any other semiconducting doped silicon alloy. The ratio of the thickness of the epitaxial intrinsic layer 60A to the thickness of the polycrystalline intrinsic base layer 60B depends on the composition of these layers, the reactant flow, and the deposition temperature and is typically in the range from about 1.1 to about 3.0, and more typically in the range from 1.3 to about 1.8. The thickness of the epitaxial intrinsic base layer 60B is in the range from about 40 nm to about 400 nm, and preferably in the range from about 80 nm to about 200 nm. The doping type of the intrinsic base layer 60 is determined by the type of the bipolar transistor, i.e., p-type in an NPN transistor or n-type in a PNP transistor. The peak doping concentration of the epitaxial intrinsic base layer 60A is in the range from about $1.0 \times 10^{17}/cm^3$ to about $1.0 \times 10^{20}/cm^3$, and preferably from about $1.0 \times 10^{18}/cm^3$ to about $1.0 \times 10^{19}/cm^3$. The peak of the dopant profile is located at a depth, measured from the top surface of the epitaxial intrinsic base layer 60A, from 0 nm to about 50 nm, and preferably from about 10 nm to about 30 nm. The doping profile and the thickness of the intrinsic base layer are optimized for performance. The doping concentration of the polycrystalline intrinsic base layer 60B is of the same order of magnitude, and typically varies by less than a factor of 3 compared to that of the epitaxial intrinsic base layer 60A.

Preferably, the thickness of the at least one pad layer (51, 52) are adjusted so that the height of the top surface of the epitaxial intrinsic base layer 60A and the height of the top surface of the polycrystalline intrinsic base layer 60B are not substantially different, for example, different by less than 50 nm, and most preferably, substantially the same within the bipolar device area B.

Figure 5:
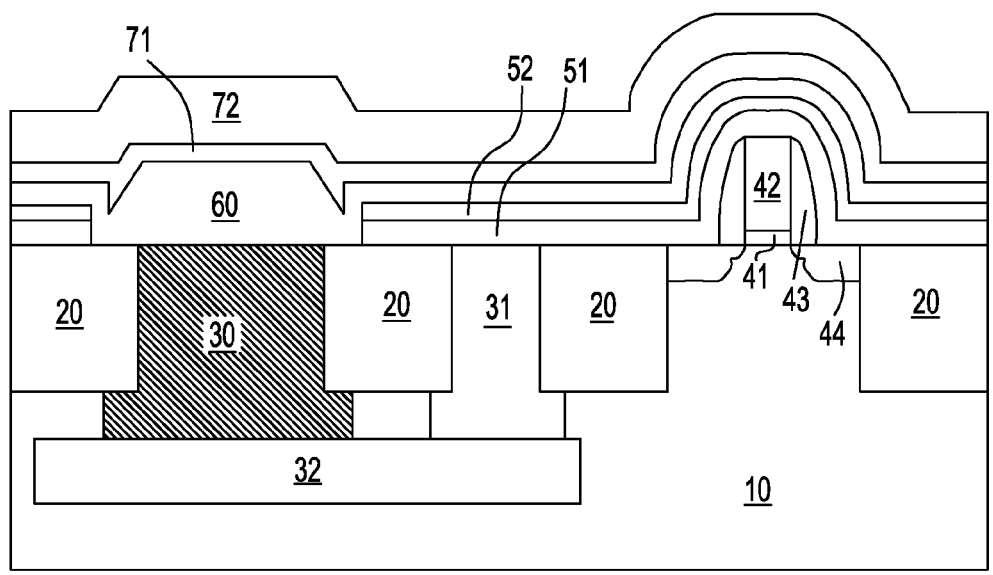
FIGS. 5-15 are sequential cross-sectional views of an exemplary BiCMOS structure according to the first embodiment of the present invention.

According to the first embodiment of the present invention, at least one emitter pedestal layer (71, 72) is formed directly on the intrinsic base layer 60 thereafter as shown in FIG. 5. The at least one emitter pedestal layer (71, 72) is formed over the bipolar device area B and over the CMOS device area C. Preferably, the at least one emitter pedestal layer (71, 72) comprises a first emitter pedestal layer 71 and a second emitter pedestal layer 72. The thickness of the first emitter pedestal layer is in the range from 5 nm to about 20 nm, and more preferably from about 10 nm to about 15 nm. The thickness of the second emitter pedestal layer is in the range from 20 nm to about 100 nm, and more preferably from about 30 nm to about 50 nm. Preferably, the first emitter pedestal layer is a silicon oxide layer and the second emitter pedestal layer is a silicon nitride layer.

Figure 6:
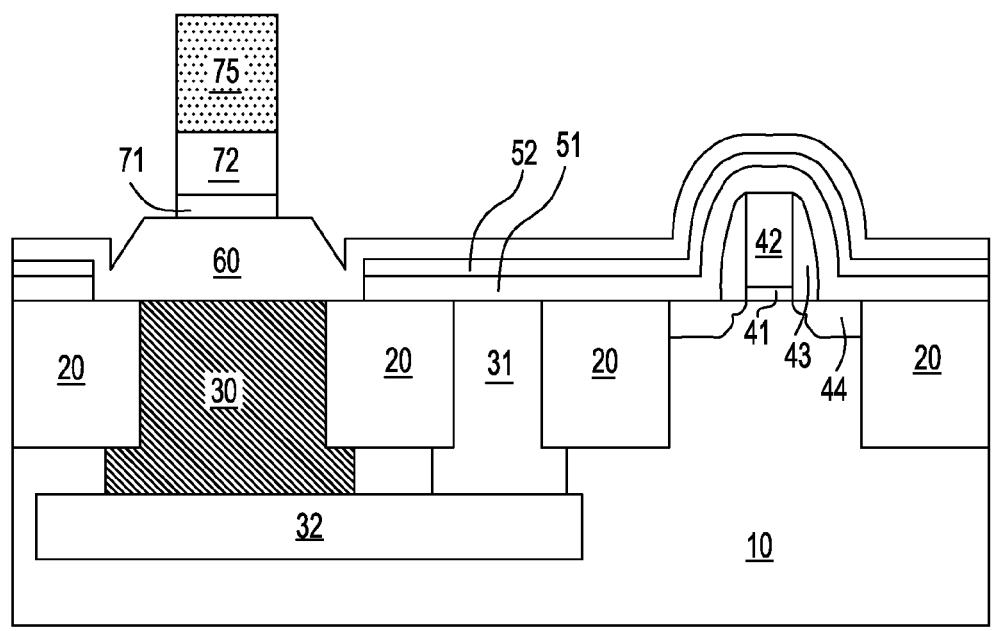

An emitter pedestal is formed by applying a first photoresist 75 and lithographically patterning and etching the at least one emitter pedestal layer (71, 72) with a reactive ion etch (RIE) as shown in FIG. 6. The RIE may be used alone or in combination with a wet etch to expose the underlying intrinsic base layer 60. If two emitter pedestal layers are used, RIE may remove the exposed portion of the second emitter pedestal layer 72 and a wet etch may be employed to remove the exposed portion of the first emitter pedestal layer 71 to produce a structure in FIG. 6.

Thereafter, the first photoresist 75 is removed. Appropriate surface clean, for example, a wet etch in hydrofluoric acid (HF), may be performed at this point.

Figure 7:
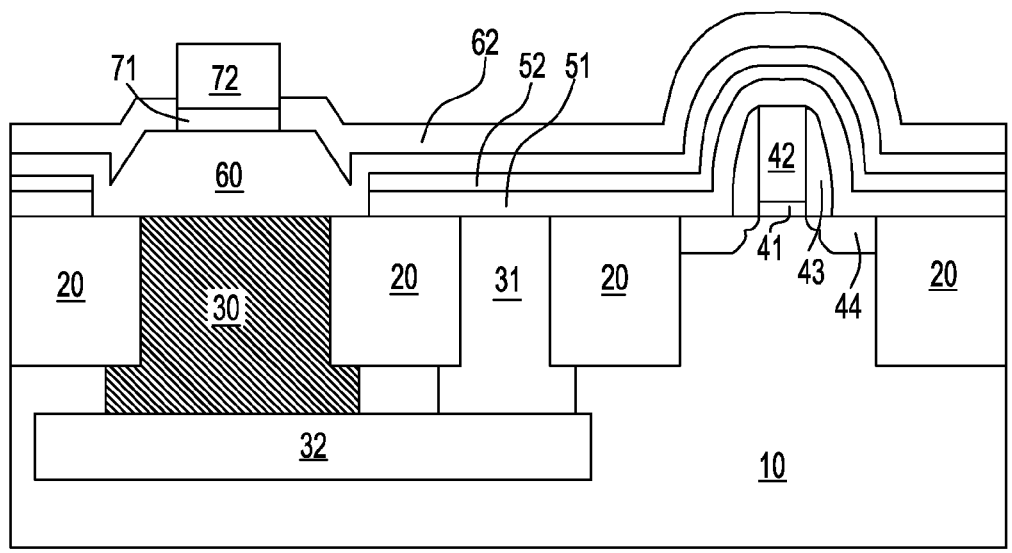

According to the first embodiment of the present invention, an extrinsic base layer 62 is formed by a selective deposition of silicon-containing material as shown in FIG. 7. The silicon-containing material may be silicon, silicon germanium alloy, silicon carbon alloy, or silicon germanium carbon alloy.

Preferably, the silicon-containing material is heavily doped with the same type of dopants as the intrinsic base layer 60. The doping concentration of the extrinsic base layer 62 is in the range from about $1.0\times10^{19}/cm^3$ to about $1.0\times10^{22}/cm^3$, and preferably from about $1.0\times10^{20}/cm^3$ to about $1.0\times10^{21}/cm^3$. The thickness of the extrinsic base layer 62 is in the range from about 10 nm to about 150 nm, and preferably in the range from about 20 nm to about 50 nm. The ratio of the doping concentration of extrinsic base layer 62 to the peak doping concentration of epitaxial intrinsic base layer 60A is in the range from about 10 to about 10,000, and preferably from about 300 to about 3000.

The selective deposition of the extrinsic base layer 62 is "selective" as implied in the name. In the selective deposition process "of the extrinsic base layer 62", a semiconductor material nucleates and deposits on a semiconductor surface, that is, on the surface of the intrinsic base layer 60, while not depositing on insulator surfaces such as the surface of the emitter pedestal that comprises the at least one emitter pedestal layer (71, 72). Therefore, the extrinsic base layer 62 grows only from the exposed intrinsic base layer 60 and does not grow from the surfaces of the emitter pedestal. The extrinsic base layer 62 is not formed over the top surface of the emitter pedestal.

Selectivity of the deposition process may be provided by an etchant such as hydrogen chloride (HCl) in the reactant stream or by germanium source such as germane ($GeH_4$) or digermane ($Ge_2H_6$). If the extrinsic base layer 62 does not contain germanium, a separate etchant needs to be supplied into a reaction chamber. If the extrinsic base layer 62 contains germanium and therefore, a germanium source gas is supplied into the reaction chamber, supplying an additional etchant is optional.

The portion of the extrinsic base layer 62 that is formed over the polycrystalline intrinsic base layer 60B is always polycrystalline, i.e., not epitaxial, since a lattice structure for an epitaxial alignment is not provided by a surface below. The portion of the extrinsic base layer 62 that is formed over the epitaxial intrinsic base layer 60 may be epitaxial or polycrystalline depending on deposition conditions and surface preparation. The selective deposition may be performed in a single wafer processing chamber or in a batch furnace. The deposition temperature is in the range from about 450° C. to about 1,000° C., and preferably from about 600° C. to about 900° C. The process pressure may vary between single wafer processing chambers and batch furnaces. Typical process pressure is in the range from about 1 Torr to 200 Torr, more preferably from about 40 Torr to about 80 Torr in a singe wafer processing chamber and is in the range from about 1 mTorr to 5 Torr, more preferably from about 5 mTorr to about 200 mTorr in a batch furnace.

Figure 8:
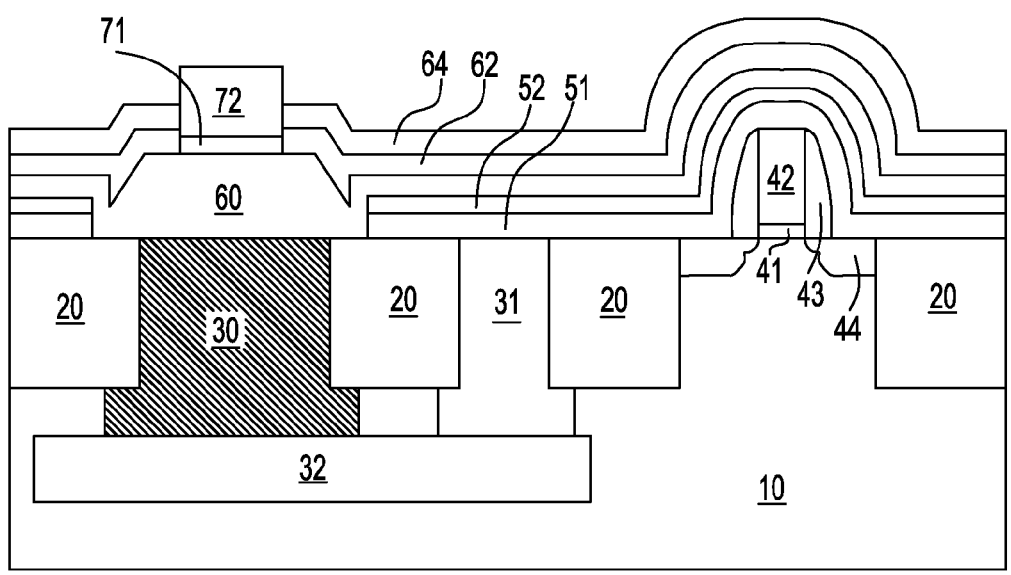

Referring to FIG. 8, a base cap dielectric layer 64 is formed directly on the underlying extrinsic base layer 62. The base cap layer 64 is selectively formed on the extrinsic base layer but is not formed on the emitter pedestal. The thickness of the base cap dielectric layer 64 is in the range from about 10 nm to about 100 nm, and preferably from about 30 nm to about 80 nm. The base cap dielectric layer 64 may be formed by thermal oxidation or by selective deposition of dielectric, such as selective deposition of silicon oxide. If the base cap dielectric layer 64 is formed by thermal oxidation, a portion of the underlying extrinsic base layer 62 is consumed and converted to silicon oxide. Thermal oxidation may be performed either at an atmospheric pressure or at a higher pressure. If an atmospheric oxidation process is used, the oxidation process temperature is in the range from about 700° C. to about 800° C. Preferably, a high pressure oxidation (HiPOx) process is employed to reduce the temperature, in which case the oxidation process temperature is in the range from about 575° C. to about 675° C. Typical process pressure for a HiPOx process is in the range from about 10 atm to about 20 atm.

Figure 9:
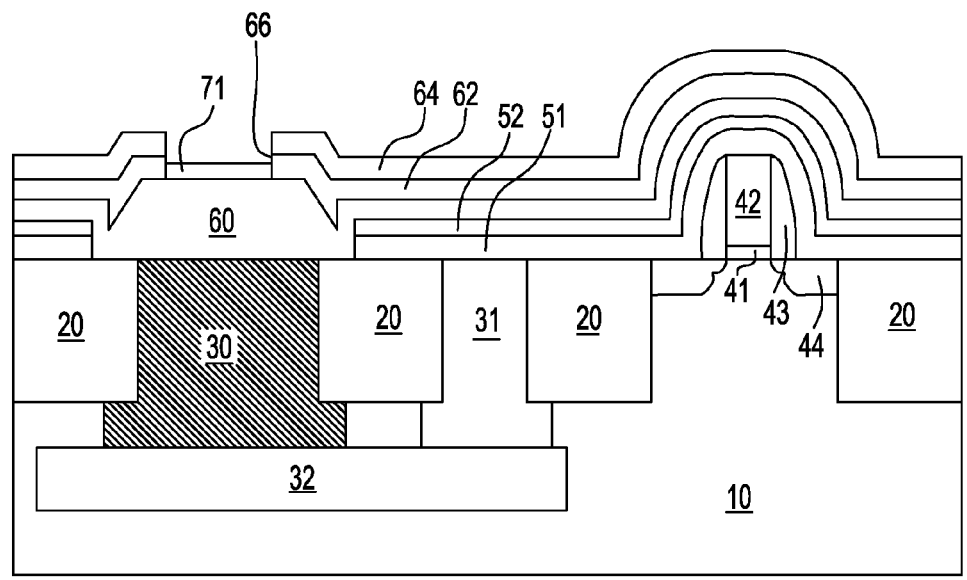

Referring to FIG. 9, a portion of the at least one emitter pedestal layer (71, 72) is removed afterwards. Preferably, the at least one emitter pedestal layer (71, 72) comprises a stack of a first emitter pedestal layer 71 and the second emitter pedestal layer 72. Preferably, the first emitter pedestal layer is a silicon oxide and the second emitter pedestal layer is a silicon nitride as noted above. In this case, the second emitter pedestal layer is removed to expose an inner extrinsic base sidewall 66 as shown in FIG. 9.

Figure 10:
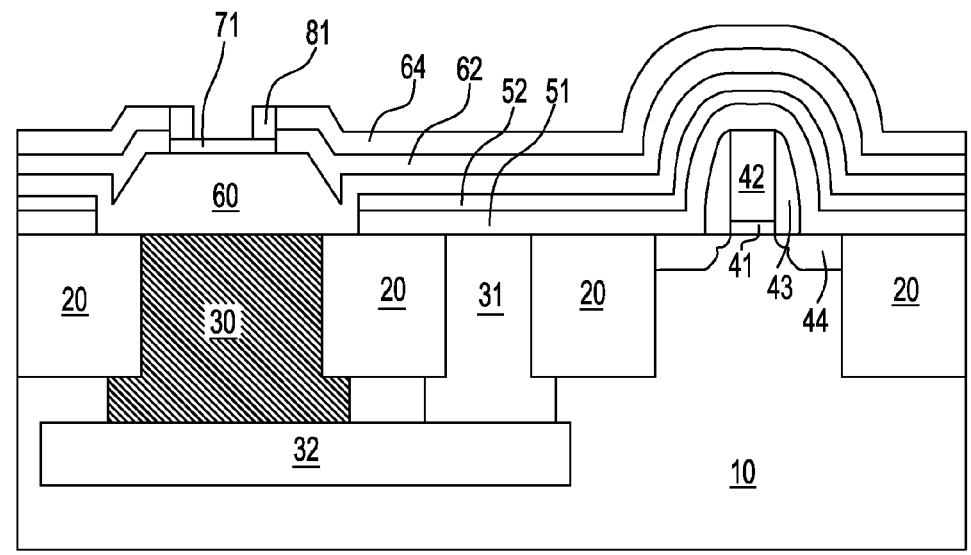

By a conformal deposition of a dielectric layer and a RIE, a spacer, to be identified as a "second spacer" 81 herebelow, is formed along the inner wall of the extrinsic base layer 62 and also along the inner wall of the base cap dielectric layer 64 as shown in FIG. 10. The second spacer 81 is a contiguous structure that is topologically homomorphic to a torus. The two inner walls are coincident as seen from above. Preferably, the second spacer 81 comprises a silicon nitride.

Figure 11:
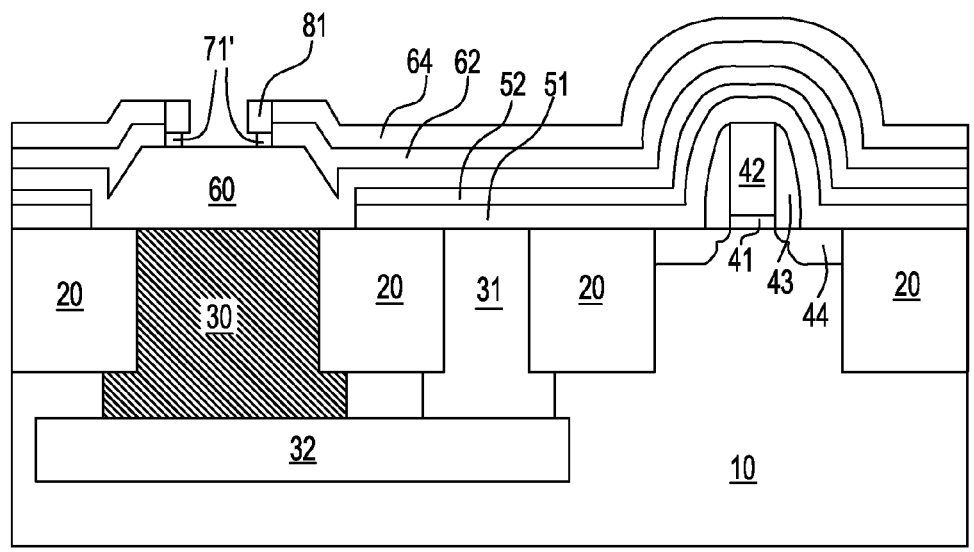

As shown in FIG. 11, another portion of the at least one emitter pedestal layer (71, 72) is removed to expose the top surface of a portion of the intrinsic base layer 60, specifically, the top surface of a portion of the epitaxial intrinsic base layer 60A. In the preferred version described above wherein the first emitter pedestal layer 71 is an oxide and the second emitter pedestal layer 72 is a nitride, the first emitter pedestal layer 71 is removed by a wet etch, for example in a hydrofluoric acid (HF) solution. The preferred thickness ranges for the first emitter pedestal layer 71 and the base oxide dielectric cap layer 64 are such that a substantial portion of the base oxide dielectric cap layer 64 still remains after such a wet etch. The wet etch creates an undercut on the remainder of the first emitter pedestal layer 71 such that the remnant of the first emitter pedestal layer 71 forms another spacer, to be identified as a "first spacer" 71' herebelow, around the opening within the second spacer 81. The first spacer 71' is a contiguous structure that is topologically homomorphic to a torus. The first spacer 71' contacts the intrinsic base 60 and the extrinsic base 62. The second spacer 81 contacts the first spacer 71', the extrinsic base 62, and the base cap dielectric layer 64.

Figure 12:
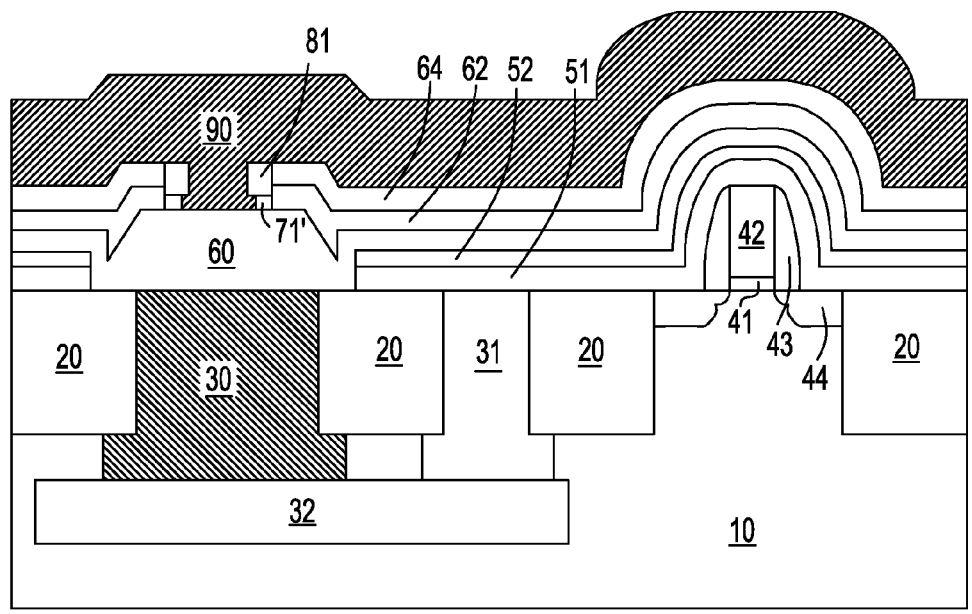

Referring to FIG. 12, a doped emitter layer 90 is deposited. The doped emitter layer 90 comprises a doped silicon-containing material and is doped with dopants of the same type as the dopants in the collector, i.e., n-type in an NPN transistor or p-type in a PNP transistor. The doping concentration of the doped emitter layer 90 is in the range from about $1.0\times10^{20}/cm^3$ to about $1.0\times10^{22}/cm^3$, and preferably from about $3.0\times10^{20}/cm^3$ to about $1.0\times10^{21}/cm^3$. The thickness of the doped emitter layer 90 is in the range from about 80 nm to about 300 nm, and preferably from about 100 nm to about 200 nm. Preferably, epitaxial alignment with the underlying intrinsic base layer 60 is avoided by forming a thin thermal oxide at the interface between the intrinsic base layer 60 and the doped emitter layer 90.

Figure 13:
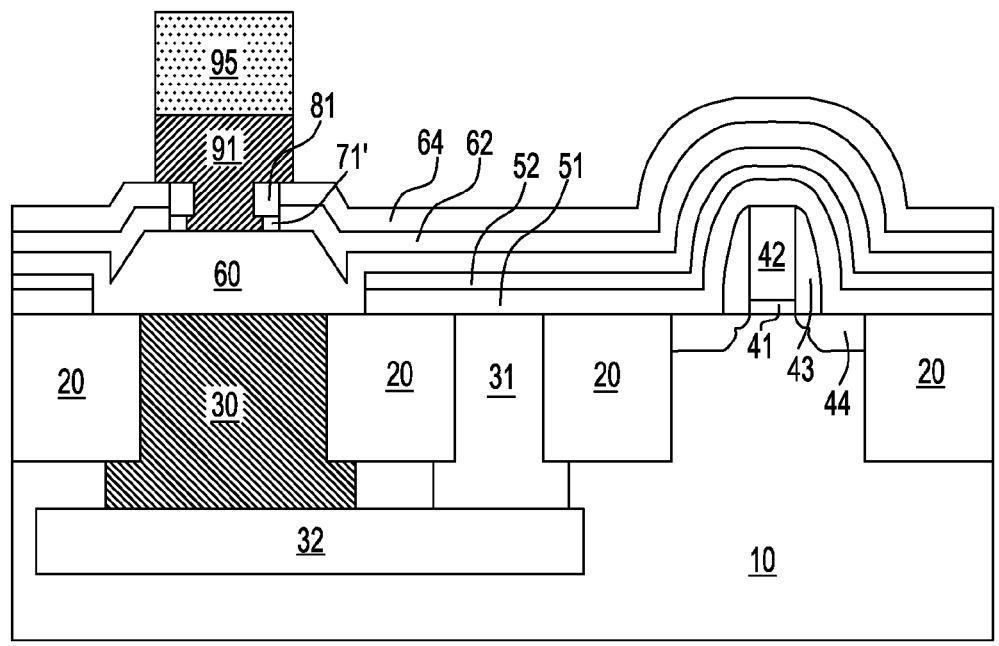

Referring to FIG. 13, a second photoresist 95 is thereafter applied over the top surface of the semiconductor structure above and lithographically patterned. This is followed by a pattern transfer into the doped emitter layer 90 to form an emitter 91. The emitter 91 completely covers the underlying second spacer 81 as seen from above. The sidewall of the emitter 91 overlies the base cap dielectric layer 64. The doped emitter layer 90 is removed from all other area that excludes the emitter 91.

Figure 14:
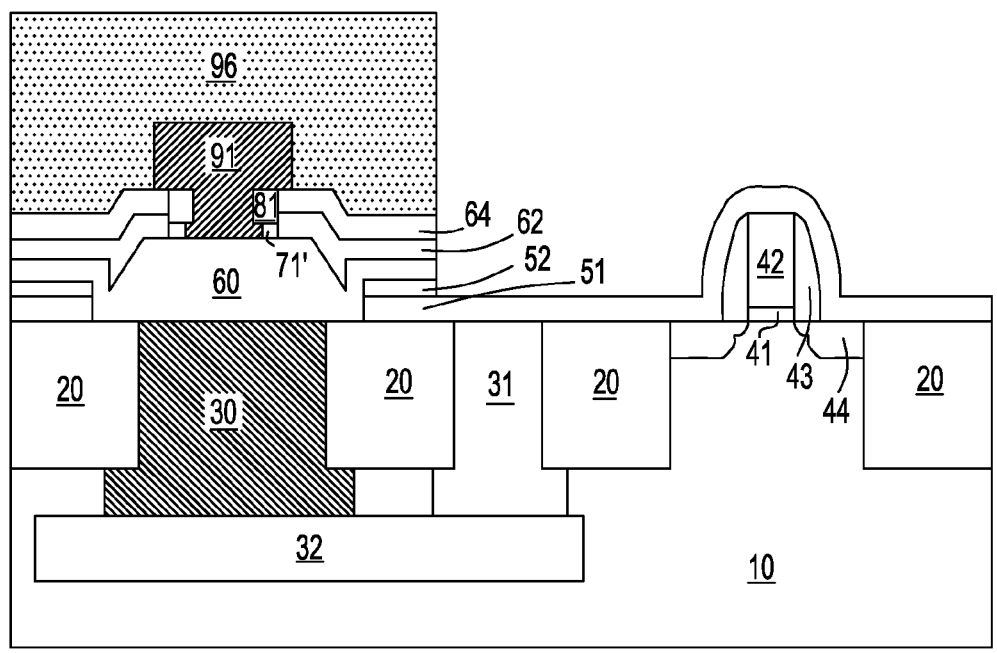

Referring to FIG. 14, a third photoresist 96 is applied over the top surface of the semiconductor structure above and lithographically patterned to define a mesa area that includes at least the area of the emitter 91 and the active semiconductor area A. This is followed by a pattern transfer into the base cap dielectric layer 64, the extrinsic base layer 62, the intrinsic base layer 60, and optionally, a portion of the at least one pad layer (51, 52) through a RIE. In a preferred version of the first embodiment, the first pad layer 51 is a silicon oxide and the second pad layer 52 is a silicon nitride. In this case, the RIE may remove exposed portions of the second pad layer 52 but does not remove the first pad layer 51. Alternatively, the RIE may remove all of the exposed pad layers (51, 52).

Figure 15:
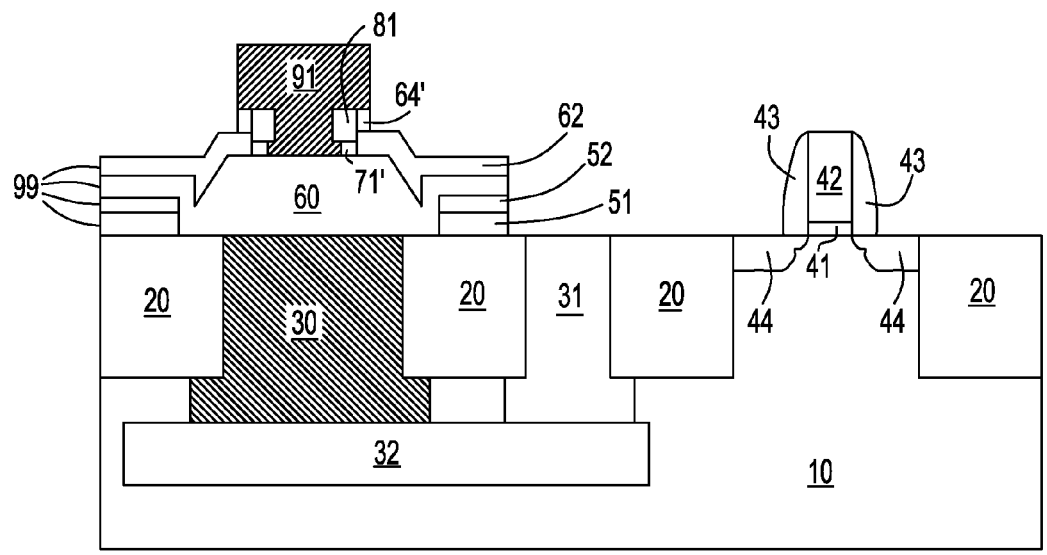

The photoresist 96 is thereafter removed. Either a wet etch or a RIE is performed to remove the remaining portion of the at least one pad layer (51, 52). The resultant structure is shown in FIG. 15. In the preferred version of the first embodiment above, the remaining portion of the first pad layer 51 is removed from all exposed area. This leaves another spacer, to be designated a "third spacer" 64' herebelow, beneath the emitter 91. The third spacer 64' is a contiguous structure that is topologically homomorphic to a torus. The third spacer 64' comprises the same material as the base cap dielectric layer 64, and is preferably a silicon oxide.

Figure 16:
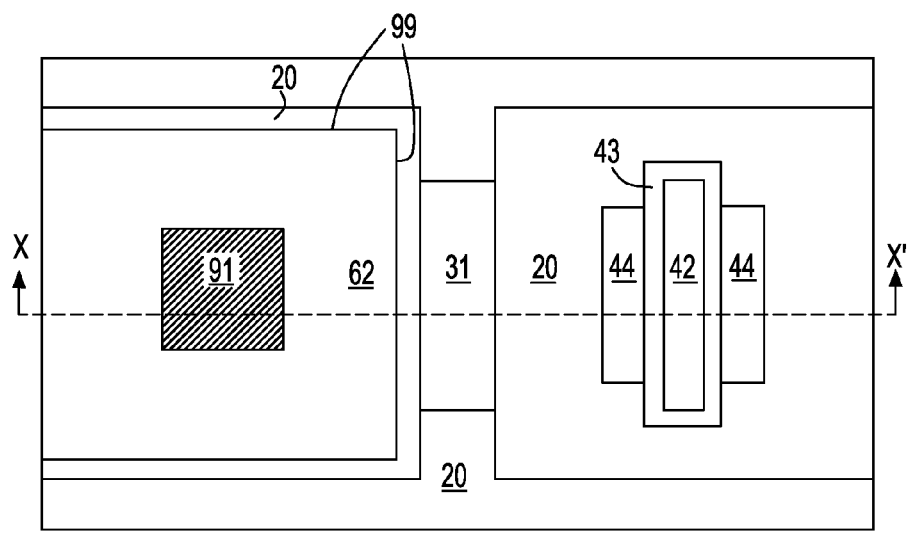
FIG. 16 is a top down view of the exemplary BiCMOS structure in FIG. 15 according to the first embodiment of the present invention. The dotted line X-X' represents the plane of the cross-sectional view in FIG. 15.

The structure in FIG. 15 has a mesa structure that comprises an extrinsic base layer 62, an intrinsic base layer 60, and at least one pad layer (51, 52). The sidewalls 99 of the mesa structure are substantially planar and vertical. FIG. 16 shows a top-down view of the structure in FIG. 15. The dotted line X-X' represents the plane of the cross-sectional view in FIG. 15. As seen from above, the sidewalls of individual layers, that is, the sidewalls of the extrinsic base layer 62, the sidewalls of the intrinsic base layer 60, and the sidewalls of the at least one pad layer (51, 52) are coincident. Seen from an arbitrary angle, the sidewalls of the individual layers thus form substantially planar and vertical sidewalls of the mesa structure.

Figure 17:
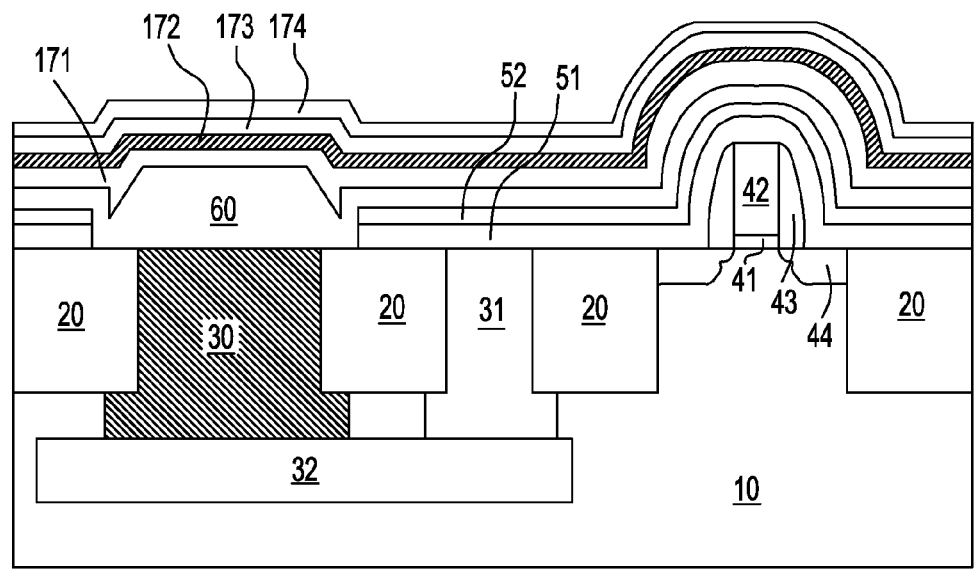
FIGS. 17-29 are sequential cross-sectional views of an exemplary BiCMOS structure according to the second embodiment of the present invention.

According to the second embodiment of the present invention, alternate methods are used to form a semiconductor structure similar to those that are shown in FIGS. 15-16. The fabrication process is the same up to the structure corresponding to FIG. 4. Instead of forming at least one emitter pedestal layer (71, 72) as shown in FIG. 5, a pedestal etch stop layer 171 is formed on the intrinsic base layer 60 as shown in FIG. 17 according to the second embodiment. The pedestal etch stop layer 171 is a dielectric layer. Preferably, the pedestal etch stop layer 171 is a silicon oxide layer. The thickness of the pedestal etch stop layer is in the range from about 5 nm to about 50 nm, and preferably in the range from 10 nm to about 30 nm.

Thereafter, at least one emitter pedestal layer (172, 173, 174) is formed on the pedestal etch stop layer. In a preferred version of the second embodiment, the at least one emitter pedestal layer (172, 173, 174) comprise a first emitter pedestal layer 172, a second emitter pedestal layer 173, and a third emitter pedestal layer 174. In a most preferred version of the second embodiment, the first emitter pedestal layer 172 is a polysilicon layer, the second emitter pedestal layer 173 is a silicon nitride layer, and the third emitter pedestal layer 174 is a silicon oxide layer. In this case, the first emitter pedestal layer 172 has a thickness in the range from about 30 nm to about 150 nm, and preferably from about 50 nm to about 100 nm; the second emitter pedestal layer 173 has a thickness in the range from about 10 nm to about 80 nm, and preferably from about 20 nm to about 50 nm; and the third emitter pedestal layer 174 has a thickness in the range from about 5 nm to about 50 nm, and preferably from about 10 nm to about 30 nm.

Figure 18:
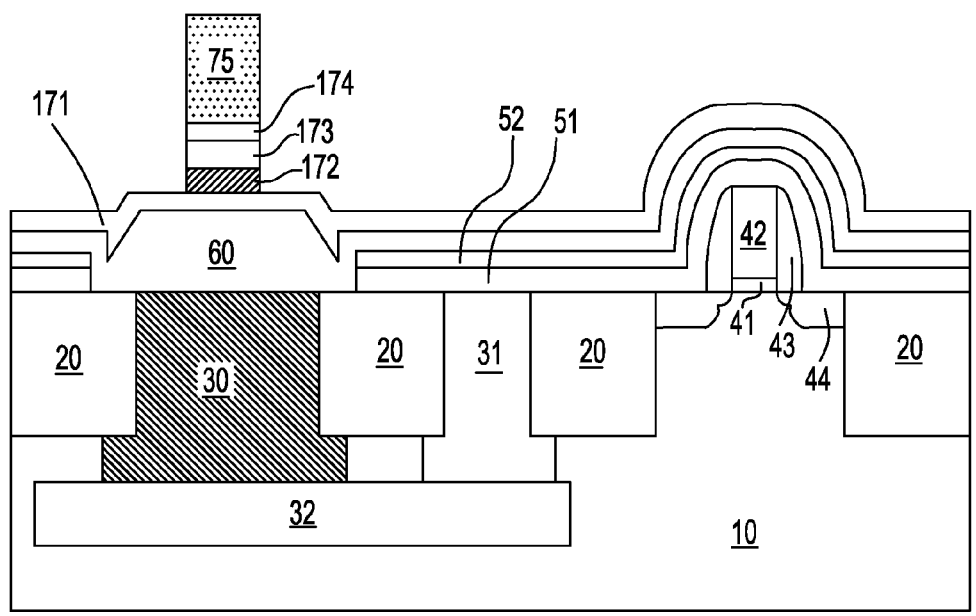

An emitter pedestal is formed by applying a first photoresist 75 and lithographically patterning and etching the at least one emitter pedestal layer (172, 173, 174) with a reactive ion etch (RIE) as shown in FIG. 18. The RIE stops on the pedestal etch stop layer 171. The emitter pedestal is defined by the remnant of the at least one emitter pedestal layer (172, 173, 174) underneath the patterned first photoresist 75 after removing the exposed portions of the at least one emitter pedestal layer (172, 173, 174). Thereafter, the first photoresist 75 is removed.

Figure 19:
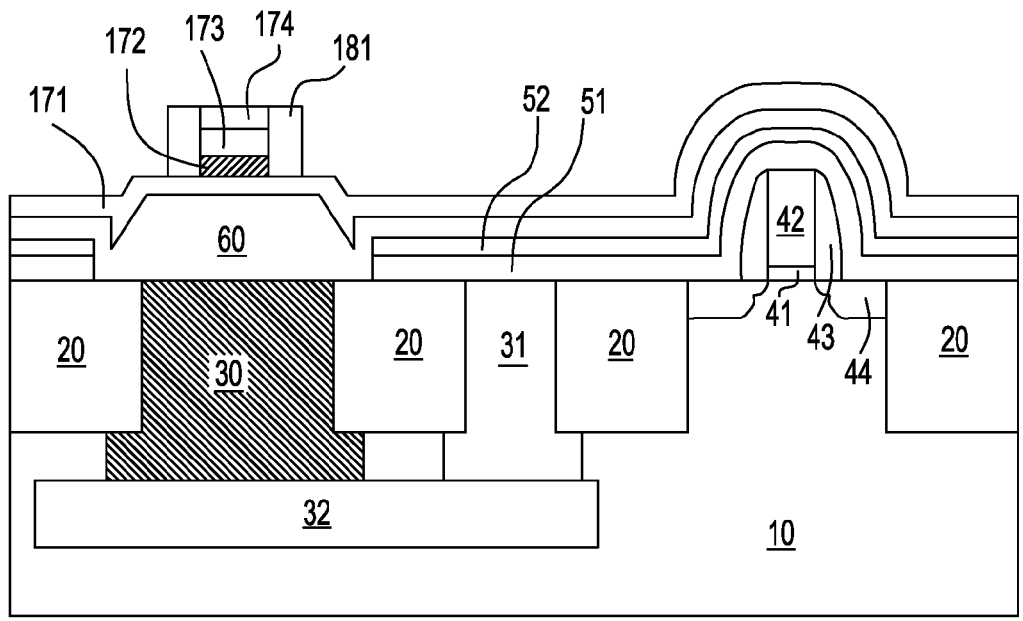

An outer pedestal spacer 181 is formed by a conformal deposition of a dielectric layer and a RIE as shown in FIG. 19. The outer pedestal spacer 181 contacts the emitter pedestal and a portion of the top surface of the pedestal etch stop layer 171. In the most preferred version of the second embodiment, the outer pedestal spacer 181 layer is a silicon nitride.

Figure 20:
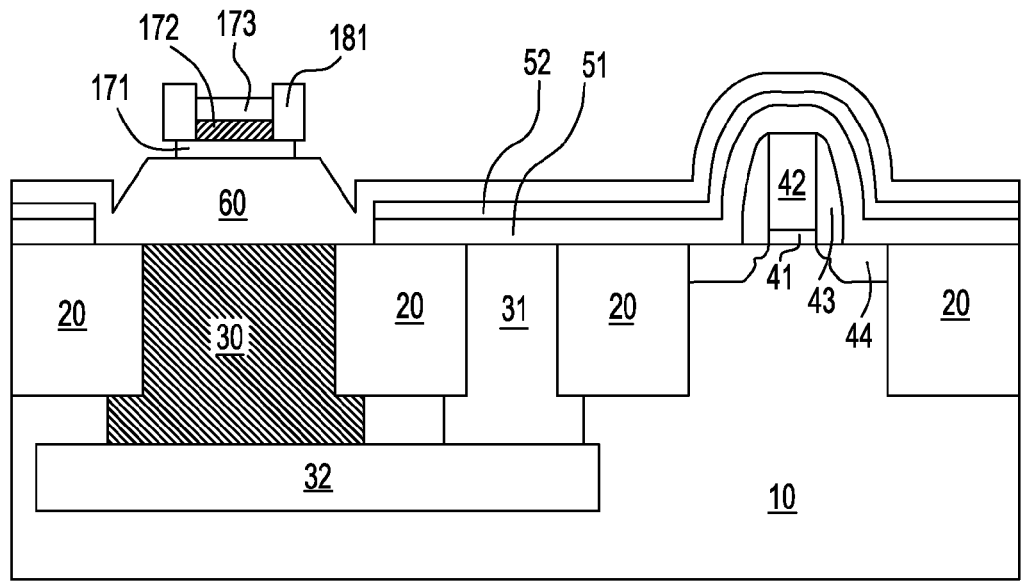

Thereafter, the exposed portions of the pedestal etch stop layer 171 and optionally a portion of the at least one emitter pedestal layer (172, 173, 174) are removed as shown in FIG. 20. In the most preferred version of the second embodiment, both the pedestal etch stop layer 171 and the third emitter pedestal layer 174 are silicon oxides and are preferably removed by a wet etch, for example in a hydrofluoric acid (HF) solution. In this version, an undercut is formed in the remaining pedestal etch stop layer 171 underneath the outer pedestal spacer 181. Also, such an wet etch may be utilized to clean the surface of the exposed top surface of the intrinsic base layer 60.

Figure 21:
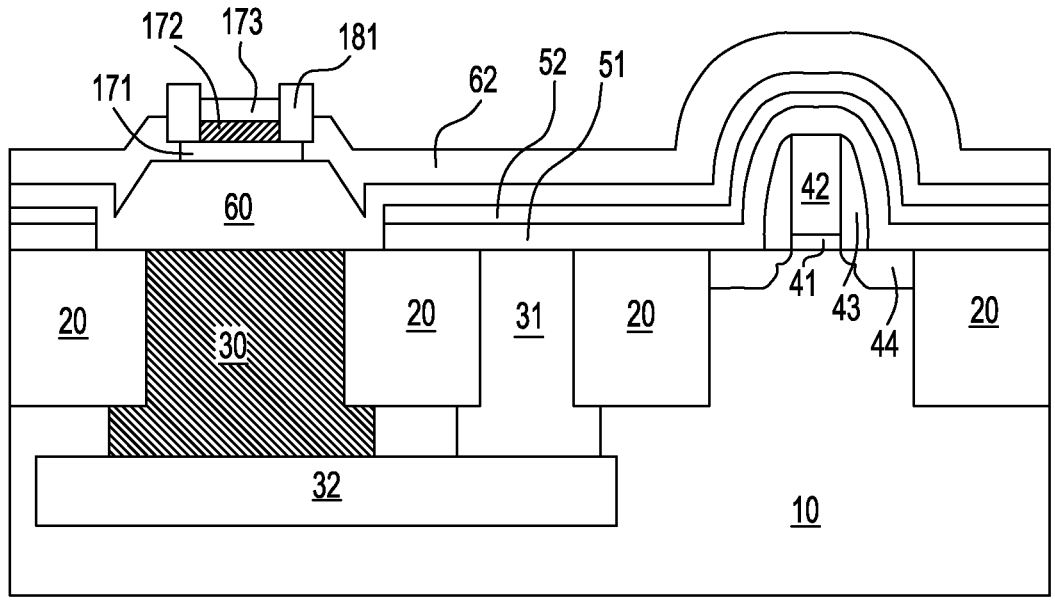

According to the second embodiment of the present invention, an extrinsic base layer 62 is formed by selective deposition of silicon-containing material as shown in FIG. 21. According to the second embodiment, the specifications for the extrinsic base layer 62 and the silicon-containing material therein, including composition, doping, thickness, and crystalline structure, are identical to that according to the first embodiment, as described in passages accompanying FIG. 7. The specifications for the selective deposition process for the extrinsic base layer 62 are identical to that according to the first embodiment, as described in passages accompanying FIG. 7 as well. Since the deposition process for the extrinsic base layer 62 is selective, the extrinsic layer 62 is not formed over the top surface of the emitter pedestal.

Figure 22:
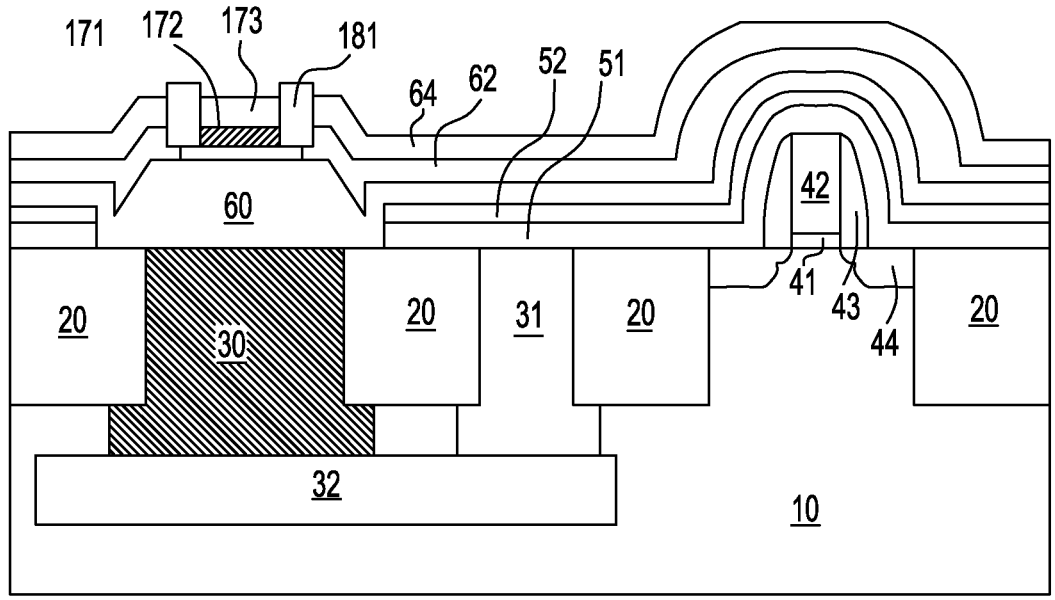

Referring to FIG. 22, a base cap dielectric layer 64 is formed directly on the underlying extrinsic base layer 62. The specifications for the structure and formation process for the base cap dielectric layer 64 according to the second embodiment is identical to those according to the first embodiment as described in passages accompanying FIG. 8.

Figure 23:
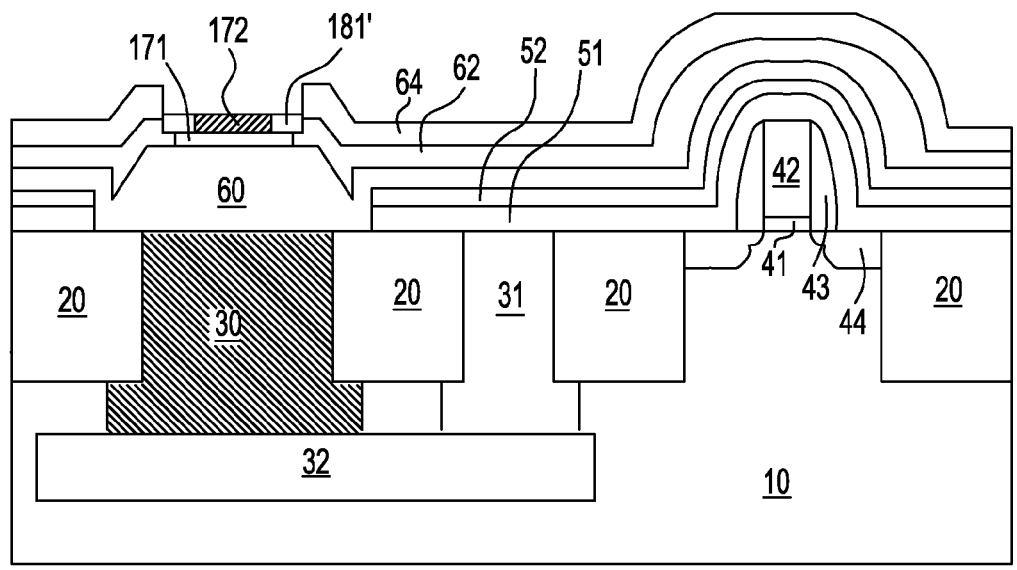

Referring to FIG. 23, a portion of the outer pedestal spacer 181 and optionally another portion of the at least one emitter pedestal layer (172, 173, 174) within the remaining emitter pedestal structure are thereafter removed preferably by wet etch. The remaining portion of the outer spacer layer 181, to be identified as a "second spacer" 181' herebelow, forms a shorter spacer contacting the extrinsic base layer 62. The second spacer 181' is a contiguous structure that is topologically homomorphic to a torus.

In the most preferred version of the second embodiment, both the outer pedestal spacer 181' and the second emitter pedestal layer 172 are silicon nitrides and are removed by a wet etch. The first emitter pedestal layer 172, which is a polysilicon layer, is exposed after the wet etch and the second spacer 181' comprises silicon nitride.

Figure 24:
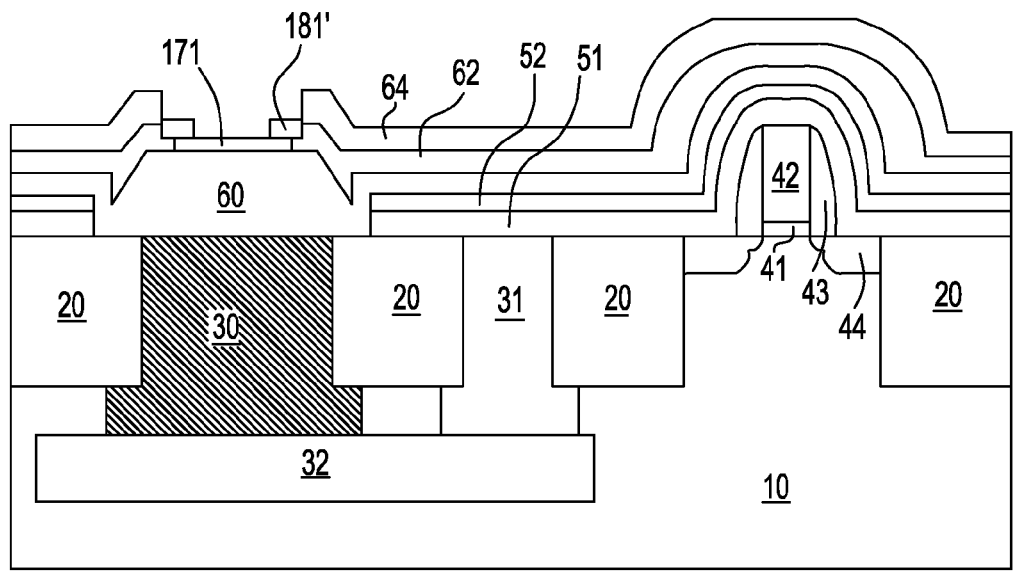

Referring to FIG. 24, another portion of the at least one emitter pedestal layer (172, 173, 174) is removed as needed to expose the pedestal etch stop layer 171. In the most preferred version of the second embodiment, the first emitter pedestal layer 172, which is a polysilicon layer, is removed by a RIE or by a wet etch and exposes the underlying pedestal etch stop layer, which is a silicon oxide in this version.

Figure 25:
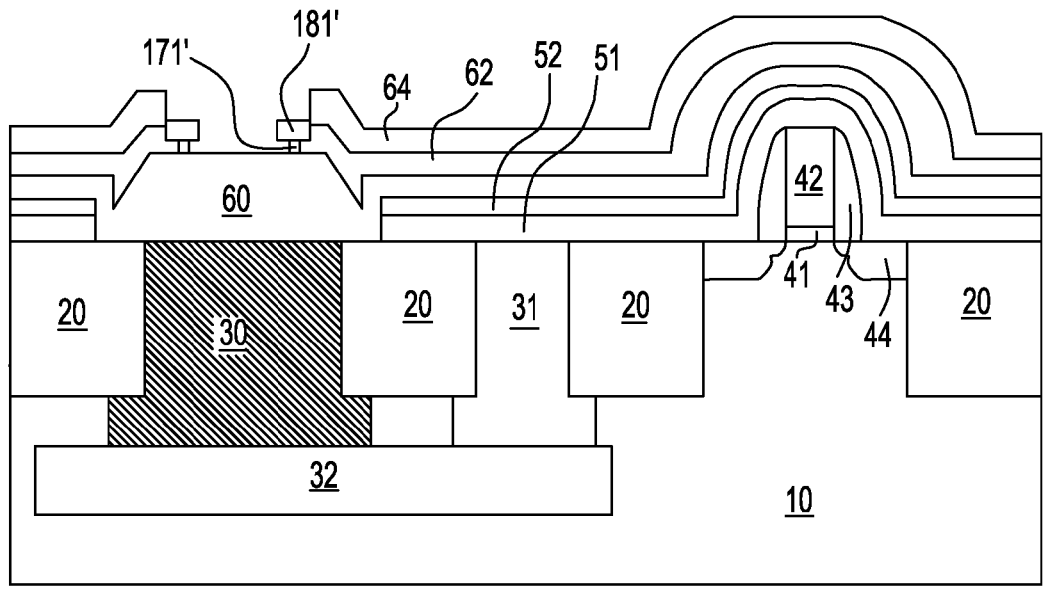

Referring to FIG. 25, a portion of the pedestal etch stop layer 171 is removed to expose a top surface of the intrinsic base layer 60 within the active semiconductor area A. The removed portion include a portion of the pedestal etch layer 171 within the area surrounded by the inner wall of the second spacer 181' as seen from above. The remnant of the etch stop layer 171, to be identified as a "first spacer" herebelow, is formed and contacts the intrinsic base layer 60 and the extrinsic base layer 62. The first spacer 171' has a continuous structure that is topologically homomorphic to a torus. In the most preferred version of the second embodiment, the pedestal etch stop layer 171' is an oxide and a wet etch in a hydrofluoric acid (HF) solution or a RIE is employed to expose the top surface of the intrinsic base layer 60. An undercut may be formed below the second spacer 181' in this version.

Figure 26:
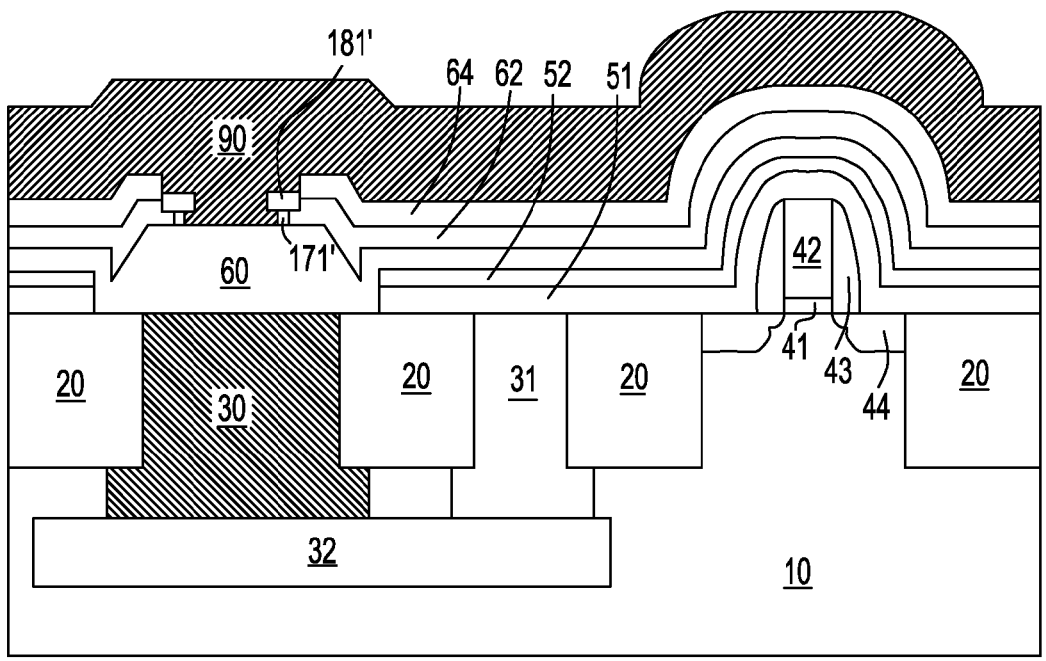

Referring to FIG. 26, a doped emitter layer 90 is deposited. The specifications for the structural and compositional aspects of the doped emitter layer 90 according to the second embodiment is identical to those according to the first embodiment as described in passages accompanying FIG. 12.

Figure 27:
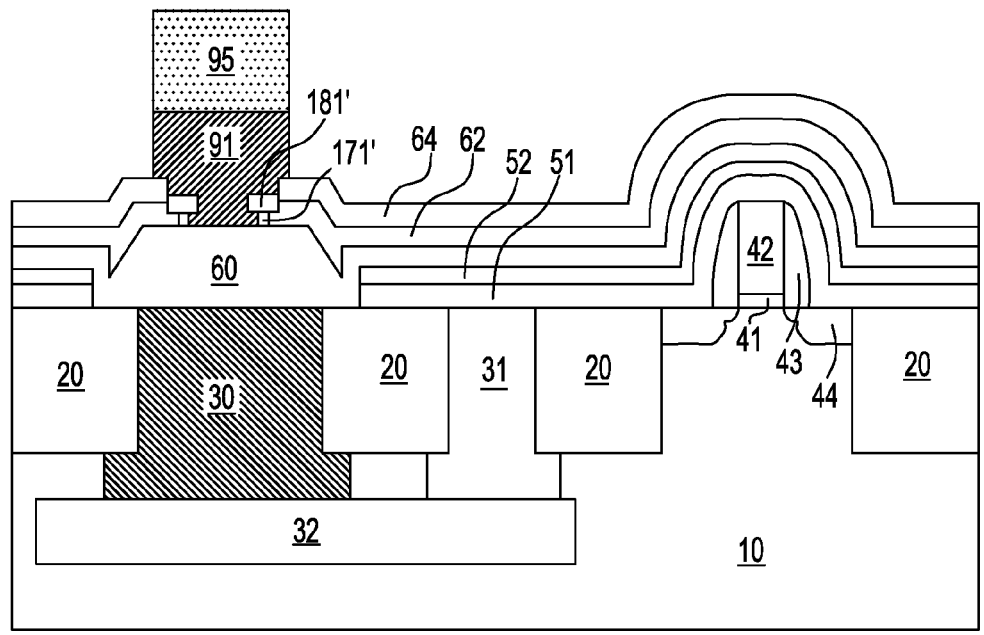

Referring to FIG. 27, a second photoresist 95 is thereafter applied over the top surface of the semiconductor structure above and lithographically patterned. This is followed by a pattern transfer into the doped emitter layer 90 to form an emitter 91. The emitter 91 covers the underlying second spacer 181' completely as seen from above. The sidewall of the emitter 91 overlies the base cap dielectric layer 64. The doped emitter layer 90 is removed from all other area that excludes the emitter 91.

Figure 28:
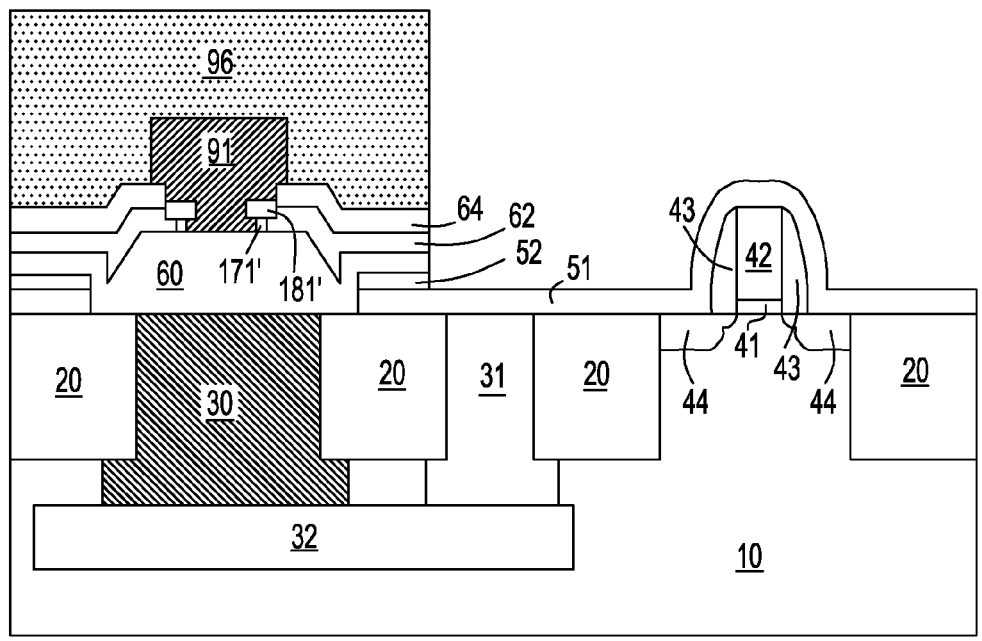

Referring to FIG. 28, a third photoresist 96 is applied over the top surface of the semiconductor structure above and lithographically patterned to define a mesa area that includes at least the area of the emitter 91 and the active semiconductor area A. This is followed by a pattern transfer into the base cap dielectric layer 64, the extrinsic base layer 62, the intrinsic base layer 60, and optionally, a portion of the at least one pad layer (51, 52) through a RIE. In a preferred version of the first embodiment, the first pad layer 51 is a silicon oxide and the second pad layer 52 is a silicon nitride. In this case, the RIE may remove exposed portions of the second pad layer 52 but does not remove the first pad layer 51. Alternatively, the RIE may remove all of the exposed pad layers (51, 52). Except for minor differences in identification numerals for the various spacers, i.e., the first spacer, the second spacer, and the third spacer, in their dimensions and in the dimensions of the emitter 91, the structure of FIG. 28 is identical to that in FIG. 14.

Figure 29:
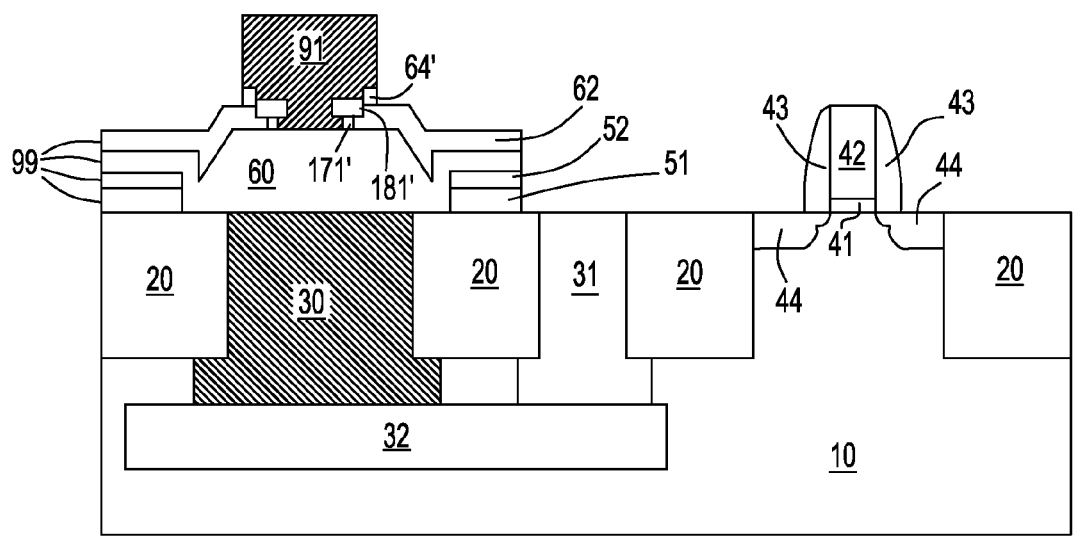

The photoresist 96 is thereafter removed. Either a wet etch or a RIE is performed to remove the remaining portion of the at least one pad layer (51, 52). The resultant structure is shown in FIG. 29. In the preferred version of the first embodiment above, the remaining portion of the first pad layer 51 is removed from all exposed area. This leaves another spacer, to be designated a "third spacer" 64' herebelow, beneath the emitter 91. The third spacer 64' is a contiguous structure that is topologically homomorphic to a torus. The third spacer 64' comprises the same material as the base cap dielectric layer 64, and is preferably a silicon oxide.

The structure in FIG. 29 has a mesa structure that comprises an extrinsic base layer 62, an intrinsic base layer 60, and at least one pad layer (51, 52). The sidewalls 99 of the mesa structure are substantially planar and vertical. Except for minor differences in identification numerals for the various spacers and in their dimensions, the structure of FIG. 29 is identical to that in FIG. 15. Therefore, the structure of FIG. 29 has the same top down view as the structure in FIG. 15, which is FIG. 16 except for minor differences in the dimensions of the emitter 91. As seen from above, the sidewalls of individual layers, that is, the sidewalls of the extrinsic base layer 62, the sidewalls of the intrinsic base layer 60, and the sidewalls of the at least one pad layer (51, 52) are coincident. Seen from an arbitrary angle, the sidewalls of the individual layers thus form substantially planar and vertical sidewalls of the mesa structure.

Throughout the accompanying figures, all the layers formed by deposition or oxidation in the bipolar device area B are also formed in the CMOS device area C. Specifically, the at least one pad layer, the intrinsic base layer, at least one emitter pedestal layer, extrinsic base layer, and the base cap layer according to the first embodiment of the present invention are formed both in the bipolar device area B and in the CMOS device area C. Also, the at least one pad layer, the intrinsic base layer, the pedestal etch stop layer, at least one emitter pedestal layer, extrinsic base layer, and the base cap layer according to the second embodiment of the present invention are formed both in the bipolar device area B and in the CMOS device area C. One aspect of the present invention is that these layers protect the CMOS devices in the CMOS device area C throughout the processes that form bipolar transistors.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A semiconductor structure comprising:
   a semiconductor substrate;
   a collector located in said semiconductor substrate;
   a shallow trench isolation (STI) structure adjoining and surrounding said collector;
   at least one pad layer located directly on said STI structure;
   an intrinsic base layer located directly on said collector and directly on said at least one pad layer;
   an emitter located directly on said intrinsic base layer;
   an extrinsic base layer self-aligned to said emitter and directly contacting said intrinsic base layer;
   a contiguous structure that is topologically homomorphic to a torus and including a dielectric material and laterally surrounding said emitter and contacting inner sidewall surfaces of said emitter, wherein outer sidewalls of said contiguous structure and outer sidewalls of said emitter are within same vertical planes; and
   a mesa structure having substantially planar and vertical sidewall surfaces, wherein each of said sidewall surfaces contains a surface of said at least one pad layer, a surface of said intrinsic base layer, and a surface of said extrinsic base layer.

2. The semiconductor structure of claim 1, further comprising at least one CMOS device located on said semiconductor substrate.

3. The semiconductor structure of claim 2, wherein said at least one pad layer comprises a stack of pad oxide layer and a pad nitride layer.

4. The semiconductor structure of claim 2, wherein said extrinsic base layer comprises a semiconductor material selected from the group that consists of a doped silicon germanium alloy, a doped silicon, a doped silicon carbon alloy, and a doped silicon germanium carbon alloy.

5. The semiconductor structure of claim 2, further comprising a first spacer located outside said emitter and contacting a set of sidewall surfaces of said emitter and a top surface of said intrinsic base layer.

6. The semiconductor structure of claim 5, further comprising a second spacer contacting a top surface of said first spacer, another set of sidewall surfaces surface of said emitter, and a sidewall of said extrinsic base layer.

7. The semiconductor structure of claim 6, wherein said another set of sidewall surface of said emitter is laterally offset inward from said set of sidewall surfaces of said emitter.

8. The semiconductor structure of claim 6, wherein an outer sidewall of said first spacer and an outer sidewall of said second spacer are within a same vertical plane.

9. The semiconductor structure of claim 6, wherein said contiguous structure contacts an outer sidewall of said second spacer and a top surface of said extrinsic base layer.

10. The semiconductor structure of claim 9, wherein said first spacer comprises a silicon oxide, said second spacer comprises a silicon nitride, and said contiguous structure comprises a silicon oxide.

11. The semiconductor structure of claim 6, wherein a set of outer sidewalls of said first spacer is laterally offset inward relative a set of outer sidewalls of said second spacer.

12. The semiconductor structure of claim 5, further comprising a second spacer contacting a top surface of said first spacer, another sidewall surface of said emitter, a horizontal surface of said extrinsic base layer, and a sidewall of said extrinsic base layer.

13. The semiconductor structure of claim 12, wherein inner sidewalls of said second spacer form an opening having a smaller area than an opening defined by inner sidewalls of said first spacer.

14. The semiconductor structure of claim 12, wherein said contiguous structure contacts an outer sidewall of said second spacer and a top surface of said extrinsic base layer.

15. The semiconductor structure of claim 14, wherein an outer sidewall of said emitter and an outer sidewall of said third spacer are not within a same vertical plane.

16. The semiconductor structure of claim 14, wherein said first spacer comprises a silicon oxide, said second spacer comprises a silicon nitride, and said contiguous structure comprises a silicon oxide.

17. The semiconductor structure of claim 1, wherein a bottom surface of said at least one pad layer is in contact with said STI structure.

18. The semiconductor structure of claim 17, wherein said intrinsic base layer is in contact with inner sidewalls of said at least one pad layer.

19. The semiconductor structure of claim 17, wherein said intrinsic base layer is in contact with said STI structure.

20. The semiconductor structure of claim 1, wherein said intrinsic base layer overlies said at least one pad layer.

* * * * *